(12) United States Patent
Nishimura et al.

(10) Patent No.: US 11,133,678 B2
(45) Date of Patent: Sep. 28, 2021

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Kazuki Nishimura, Chuo-ku (JP); Toshihide Nakano, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/981,876

(22) PCT Filed: Mar. 19, 2018

(86) PCT No.: PCT/JP2018/010813
§ 371 (c)(1),
(2) Date: Sep. 17, 2020

(87) PCT Pub. No.: WO2019/180784
PCT Pub. Date: Sep. 26, 2019

(65) Prior Publication Data
US 2021/0098991 A1    Apr. 1, 2021

(51) Int. Cl.
| | |
|---|---|
| *H02J 1/10* | (2006.01) |
| *H02J 3/32* | (2006.01) |
| *H02J 9/06* | (2006.01) |
| *H02M 1/32* | (2007.01) |
| *H02M 7/48* | (2007.01) |
| *H05K 7/20* | (2006.01) |

(52) U.S. Cl.
CPC ............. *H02J 3/32* (2013.01); *H02J 9/061* (2013.01); *H02J 9/062* (2013.01); *H02M 1/32* (2013.01); *H02M 7/48* (2013.01); *H05K 7/2089* (2013.01)

(58) Field of Classification Search
CPC .... H02J 3/32; H02J 9/061; H02J 9/062; H02J 9/06; H02M 1/32; H02M 7/48; H02M 7/02; H05K 7/2089
USPC ......................................................... 307/43
See application file for complete search history.

(56) References Cited

U.S. PATENT DOCUMENTS

| | | | |
|---|---|---|---|
| 6,175,511 B1 | 1/2001 | Ooba | |
| 2012/0086269 A1* | 4/2012 | Nakano | ................ H02J 9/062 307/23 |

FOREIGN PATENT DOCUMENTS

JP    2001-186689 A    7/2001

OTHER PUBLICATIONS

International Search Report dated Apr. 17, 2018 in PCT/JP2018/010813 filed on Mar. 19, 2018.

\* cited by examiner

*Primary Examiner* — Richard Tan
(74) *Attorney, Agent, or Firm* — Oblon, McClelland, Maier & Neustadt, L.L.P.

(57) ABSTRACT

This uninterruptible power supply includes: a cooler (6) that dissipates heat of a converter (1) and an inverter (5); and a controller (8) that causes, when output power (Po) from the inverter (5) exceeds an upper limit value (PoH), reduces input power (Pi) to the converter (1) by power ($\Delta Po=Po-PoH$) corresponding to a difference between them, and increases input power (Pb) to a bidirectional chopper (4) by power ($2\times PoH$) that is twice as high as the power ($\Delta Po$) corresponding to the difference.

8 Claims, 10 Drawing Sheets

POWER CONVERSION DEVICE

TECHNICAL FIELD

The present invention relates to a power conversion device, and more particularly to a power conversion device including a third power converter for converting DC power supplied from at least one of first and second power converters into AC power and supplying the converted power to a load.

BACKGROUND ART

Japanese Patent Laying-Open No. 2001-186689 (PTL 1), for example, discloses an uninterruptible power supply including: a rectifier for converting AC power from an AC power source into DC power and supplying the converted power to a DC line; a chopper connected between a battery and the DC line; and an inverter for converting DC power from the DC line into AC power and supplying the converted power to a load.

During a normal time when output power from an inverter is smaller than an upper limit value while an AC power source is sound, DC power generated by a rectifier is converted into AC power by the inverter and supplied to a load. During an overload when the output power from the inverter exceeds the upper limit value while the AC power source is sound, DC power having the upper limit value is supplied from the rectifier to the inverter, and a shortage of DC power is compensated for by a supply from a battery to the inverter through a chopper (see FIG. 8). Thus, input power to the rectifier can be limited to the upper limit value or lower.

During an interruption of the AC power source, DC power of the battery is supplied to the inverter through the chopper, converted into AC power and supplied to the load. Thus, operation of the load can be continued even during the interruption.

CITATION LIST

Patent Literature

PTL 1: Japanese Patent Laying-Open No. 2001-186689

SUMMARY OF INVENTION

Technical Problem

An uninterruptible power supply is generally provided with first and second coolers for dissipating heat generated at a rectifier and an inverter, respectively. The first cooler has a cooling capability (that is, size) to dissipate generated heat when input power to the rectifier reaches an upper limit value. The second cooler has a cooling capability (that is, size) to dissipate heat generated at the inverter during an overload. In a conventional uninterruptible power supply, therefore, the first and second coolers are disadvantageously increased in size, resulting in an increased dimension of the power supply.

A main object of the present invention, therefore, is to provide a power conversion device capable of limiting input power to a first power converter to an upper limit value or lower, and having a reduced size.

Solution to Problem

A power conversion device according to the present invention includes: a first power converter that converts first power supplied from a first power source into DC power; a second power converter that converts second power supplied from a second power source into DC power; a third power converter that converts DC power supplied from at least one of the first and second power converters into AC power and supplies the converted power to a load; a cooler that is provided in common for the first and third power converters, and that dissipates heat generated at the first and third power converters; and a controller, wherein when output power from the third power converter is smaller than an upper limit value, the controller causes only the first power converter to supply DC power to the third power converter, and in response to the output power from the third power converter exceeding the upper limit value, the controller causes both the first and second power converters to supply DC power to the third power converter, and reduces input power to the first power converter and increases input power to the second power converter while maintaining a sum of the input powers to the first and second power converters at the output power from the third power converter.

Advantageous Effects of Invention

In the power conversion device according to the present invention, when the output power from the third power converter exceeds the upper limit value, both the first and second power converters supply DC power to the third power converter, and input power to the first power converter is reduced and input power to the second power converter is increased. Thus, the input power to the first power converter can be limited to the upper limit value or lower. In addition, since the cooler is provided in common for the first and third power converters, and the input power to the first power converter is reduced in response to the output power from the third power converter exceeding the upper limit value, the size of the cooler can be kept small, leading to a reduced size of the device.

DESCRIPTION OF EMBODIMENTS

First Embodiment

Figure 1:
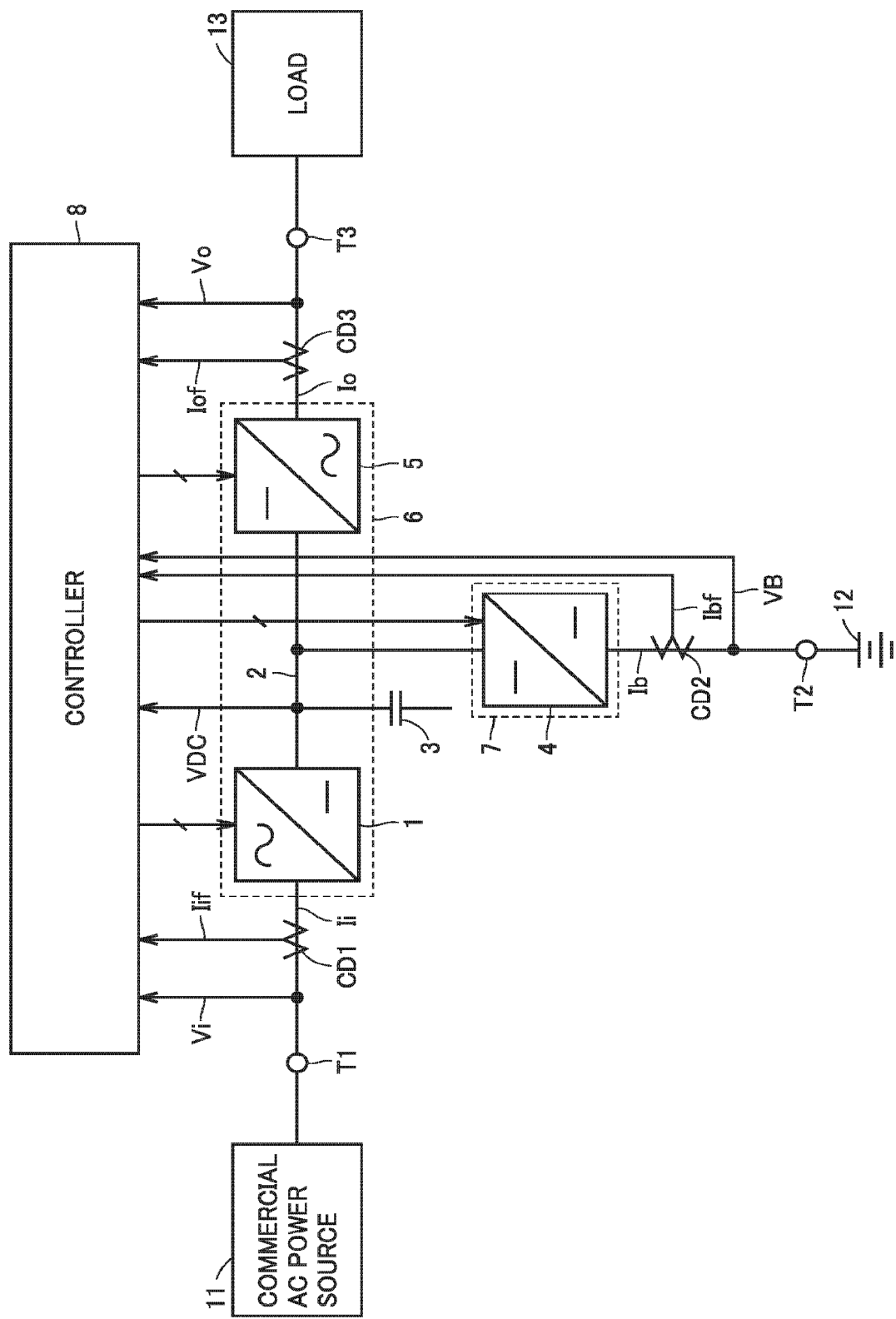
FIG. 1 is a block diagram showing the configuration of an uninterruptible power supply according to a first embodiment of the present invention.

FIG. 1 is a block diagram showing the configuration of an uninterruptible power supply according to a first embodiment of the present invention. In FIG. 1, this uninterruptible power supply includes an input terminal T1, a battery terminal T2, an output terminal T3, current detectors CD1 to CD3, a converter 1, a DC line 2, a capacitor 3, a bidirectional chopper 4, an inverter 5, coolers 6, 7, and a controller 8.

Input terminal T1 receives AC power having a commercial frequency from a commercial AC power source 11 (first power source). Battery terminal T2 is connected to a battery 12 (second power source). Battery 12 stores DC power. A capacitor may be connected instead of battery 12. Output terminal T3 is connected to a load 13. Load 13 is driven with AC power having a commercial frequency supplied from the uninterruptible power supply.

Converter 1, DC line 2 and inverter 5 are connected in series between input terminal T1 and output terminal T3. Capacitor 3 is connected to DC line 2, and smooths a DC voltage VDC at DC line 2. Bidirectional chopper 4 is connected between battery terminal T2 and the DC line.

Although an input filter is provided between input terminal T1 and converter 1 and an output filter is provided between inverter 5 and output terminal T3 in an actual uninterruptible power supply, the input filter and the output filter are not shown in order to simplify the illustration and description. Each of the input filter and the output filter is a low-pass filter including a reactor and a capacitor, which allows the passage of a current having a commercial frequency while preventing the passage of a current having a switching frequency.

An instantaneous value of an AC input voltage Vi supplied from commercial AC power source 11 is detected by controller 8. An instantaneous value of an AC output voltage Vo applied to load 13 is detected by controller 8. An instantaneous value of DC voltage VDC at DC line 2 is detected by controller 8. An instantaneous value of an inter-terminal voltage VB of battery 12 is detected by controller 8.

Current detector CD1 (first current detector) detects an AC input current Ii flowing from commercial AC power source 11 to converter 1, and provides a signal Iif indicating the detected value to controller 8. Current detector CD2 (second current detector) detects a DC current Ib flowing between battery 12 and bidirectional chopper 4, and provides a signal Ibf indicating the detected value to controller 8. Current detector CD3 (third current detector) detects an AC output current Io flowing from inverter 5 to load 13, and provides a signal Iof indicating the detected value to controller 8.

Controller 8 controls each of converter 1, bidirectional chopper 4, and inverter 5 based on AC input voltage Vi, AC output voltage Vo, DC voltage VDC, battery voltage VB, AC input current Ii, DC current Ib, and AC output current Io.

Converter 1 (first power converter) is controlled by controller 8, and converts AC power from commercial AC power source 11 into DC power and outputs the converted power to DC line 2. Converter 1 is a known converter including a plurality of sets of insulated gate bipolar transistors (IGBTs) and diodes. AC input current Ii to converter 1 is controllable.

During a normal time when output power Po from inverter 5 is smaller than an upper limit value PoH while AC power is normally supplied from commercial AC power source 11 (while commercial AC power source 11 is sound), AC input current Ii to converter 1 is controlled such that DC voltage VDC at DC line 2 reaches a reference DC voltage VDCr.

During an overload when output power Po from inverter 5 exceeds upper limit value PoH while commercial AC power source 11 is sound, AC input current Ii to converter 1 is reduced such that input power Pi to converter 1 decreases by power ΔPo=Po−PoH corresponding to a difference between output power Po from inverter 5 and upper limit value PoH. When the supply of AC power from commercial AC power source 11 is stopped (when commercial AC power source 11 is interrupted), the operation of converter 1 is stopped.

Bidirectional chopper 4 (second power converter) is controlled by controller 8, and provides and receives DC power between DC line 2 and battery 12. Bidirectional chopper 4 is a known bidirectional chopper including a plurality of sets of IGBTs and diodes, and a reactor. Current Ib flowing between battery 12 and bidirectional chopper 4 is controllable. Bidirectional chopper 4 selectively performs either step-down operation of stepping down DC voltage VDC at DC line 2 and providing the stepped-down voltage to battery 12, or step-up operation of stepping up inter-terminal voltage VB of battery 12 and providing the stepped-up voltage to DC line 2.

During a normal time when output power Po from inverter 5 is smaller than upper limit value PoH while commercial AC power source 11 is sound, bidirectional chopper 4 causes DC current Ib to flow from DC line 2 to battery 12 such that battery voltage VB reaches a reference battery voltage VBr.

During an overload when output power Po from inverter 5 exceeds upper limit value PoH while commercial AC power source 11 is sound, bidirectional chopper 4 causes DC current Ib to flow from battery 12 to DC line 2 such that DC voltage VDC at DC line 2 reaches reference DC voltage VDCr. As a result, DC power is supplied from battery 12 to inverter 5 by power 2ΔPo that is twice as high as power ΔPo=Po−PoH corresponding to the difference between output power Po from inverter 5 and upper limit value PoH.

That is, during an overload, DC power of PoH−ΔPo is supplied from converter 1 to inverter 5, and DC power of 2ΔPo is supplied from battery 12 to inverter 5 through bidirectional chopper 4, leading to a supply of DC power of PoH+ΔPo in total to inverter 5. AC power of PoH+ΔPo is supplied from inverter 5 to load 13.

During an interruption of commercial AC power source 11, bidirectional chopper 4 causes DC current Ib to flow from battery 12 to DC line 2 such that DC voltage VDC at DC line 2 reaches reference DC voltage VDCr. As a result, DC power corresponding to output power Po from inverter 5 is supplied from only battery 12.

Inverter 5 (third power converter) is controlled by controller 8, and converts DC power supplied from converter 1 and bidirectional chopper 4 through DC line 2 into AC power having a commercial frequency and supplies the converted power to load 13. Inverter 5 is a known inverter including a plurality of sets of IGBTs and diodes. AC output current Io from inverter 5 is controllable. Inverter 5 supplies AC current Io to load 13 such that AC output voltage Vo reaches a reference AC voltage Vor.

If load 13 is a motor, for example, current Io flowing from inverter 5 to load 13 may vary, causing output power Po from inverter 5 to exceed upper limit value PoH. Inverter 5 is formed to be able to output power Po greater than upper limit value PoH (for example, 1.5×PoH) within a prescribed period of time.

Cooler 6 is provided in common for converter 1 and inverter 5, and dissipates heat generated at converter 1 and inverter 5 into the air, to prevent excessive temperature increase in and breakage of converter 1 and inverter 5. Cooler 7 dissipates heat generated at bidirectional chopper 4 into the air, to prevent excessive temperature increase in and breakage of bidirectional chopper 4.

Figure 2:
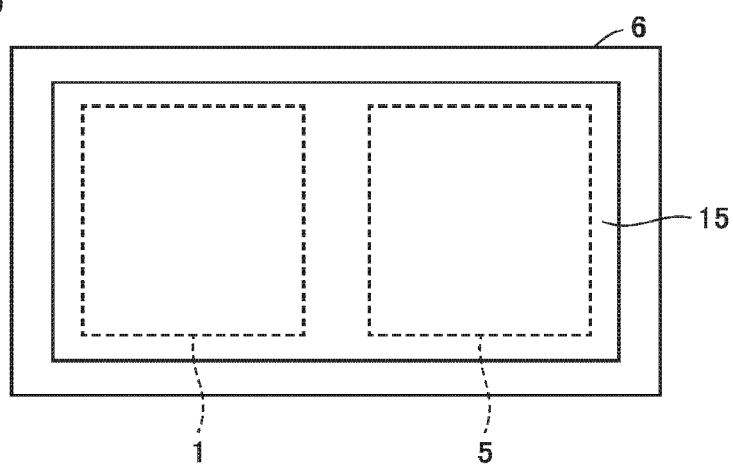
FIG. 2 shows the configuration of a cooler shown in FIG. 1.
Figure 2:
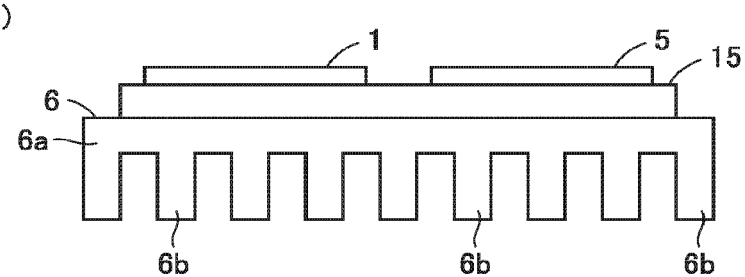

FIGS. 2(A) and (B) show the configuration of cooler 6. In particular, FIG. 2(A) is a plan view of cooler 6, and FIG. 2(B) is a front view of cooler 6. In FIGS. 2(A) and (B), cooler 6 includes a flat plate portion 6a and numerous heat dissipating fins 6b. Cooler 6 is formed of a metal having a high thermal conductivity (for example, aluminum).

On a front surface of flat plate portion 6a, a substrate 15 on which converter 1 and inverter 5 have been formed is mounted. Numerous heat dissipating fins 6b are formed on a rear surface of flat plate portion 6a. Cooler 6 and substrate 15 constitute an integral unit. Air is blown to numerous heat dissipating fins 6b from a fan (not shown).

When converter 1 and inverter 5 are driven, heat is generated at converter 1 and inverter 5. The heat generated at converter 1 and inverter 5 is transferred to each heat dissipating fin 6b through flat plate portion 6a, and dissipated into the air through a surface of each heat dissipating fin 6b. Temperature increase in converter 1 and inverter 5 is thereby suppressed.

In the first embodiment, a sum of input power Pi to converter 1 and output power Po from inverter 5 reaches upper limit value PoH during an overload, and therefore, a heat dissipating capability of cooler 6, that is, the size of cooler 6, is set such that the temperature of substrate 15 does not exceed an upper limit temperature TH even when Pi+Po reaches PoH. Cooler 7 is identical in configuration to cooler 6, and thus description thereof will not be repeated.

Figure 3:
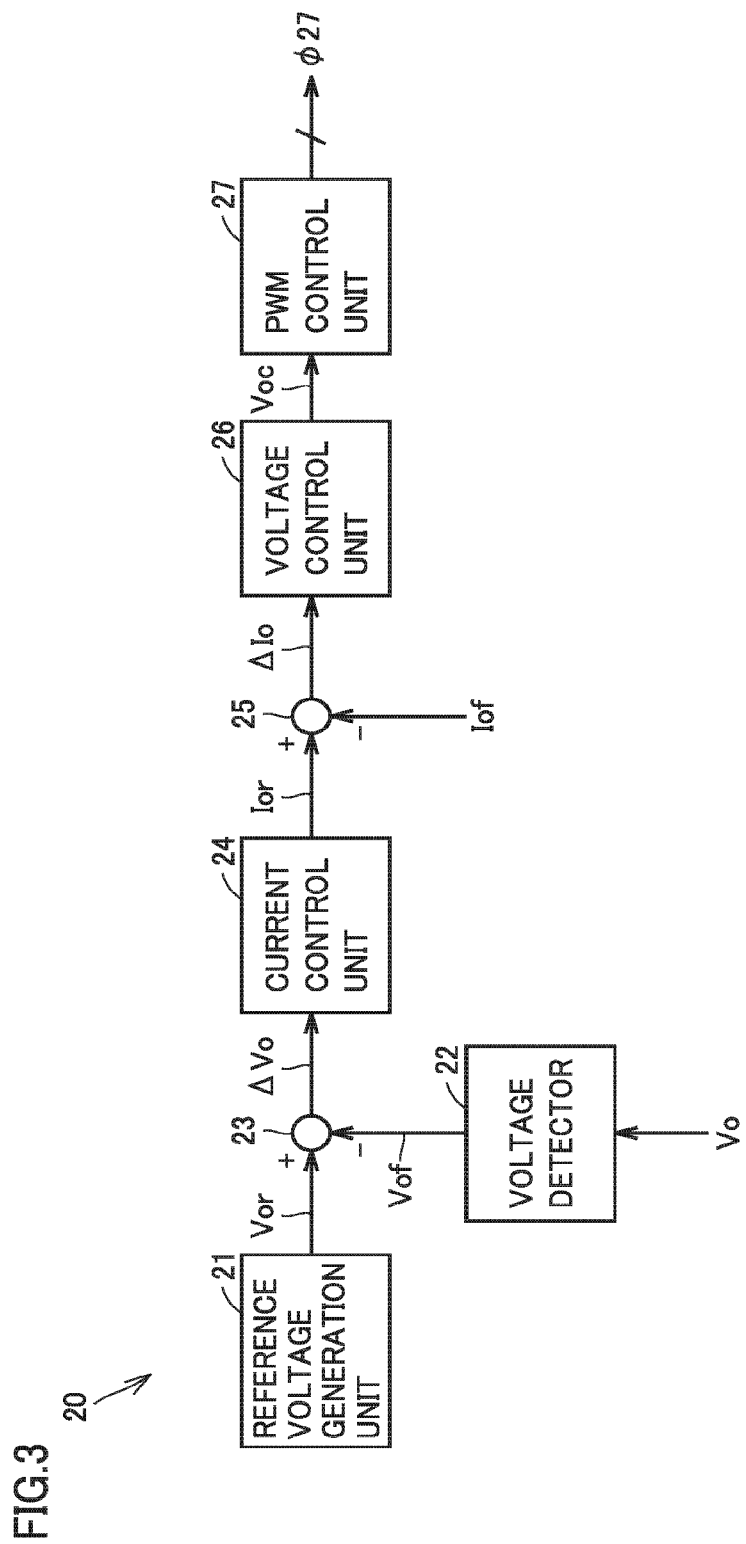
FIG. 3 is a block diagram showing the configuration of a portion pertaining to control of an inverter in a controller shown in FIG. 1.

FIG. 3 is a block diagram showing the configuration of a portion pertaining to control of inverter 5 in controller 8. In FIG. 3, controller 8 includes a control circuit 20 (first control circuit), and control circuit 20 has a reference voltage generation unit 21, a voltage detector 22, subtracters 23, 25, a current control unit 24, a voltage control unit 26, and a pulse width modulation (PWM) control unit 27.

Reference voltage generation unit 21 generates reference AC voltage Vor, which is the rated voltage of load 13. Voltage detector 22 detects input voltage Vo to load 13, and generates a signal Vof indicating the detected value. Subtracter 23 determines a deviation $\Delta$Vo=Vor−Vof between reference AC voltage Vor and output signal Vof from voltage detector 22. Current control unit 24 adds a value proportionate to deviation $\Delta$Vo and a value proportionate to an integrated value of deviation $\Delta$Vo, to determine a current command value Ior (first current command value).

Subtracter 25 determines a deviation $\Delta$Io=Ior−Iof between current command value Ior and output signal Iof from current detector CD3. Voltage control unit 26 adds a value proportionate to deviation $\Delta$Io and a value proportionate to an integrated value of deviation $\Delta$Io, to determine a voltage command value Voc. PWM control unit 27 compares voltage command value Voc and a triangular wave signal to generate a PWM control signal $\phi$27, and provides the generated signal to inverter 5. Inverter 5 convers DC power into AC power in accordance with PWM control signal $\phi$27.

That is, control circuit 20 generates current command value Ior such that input voltage Vo to load 13 reaches reference AC voltage Vor, and controls inverter 5 such that detected value Io from current detector CD3 reaches current command value Ior. Accordingly, input voltage Vo to load 13 is maintained at reference AC voltage Vor even when current Io flowing from inverter 5 to load 13 varies.

Figure 4:
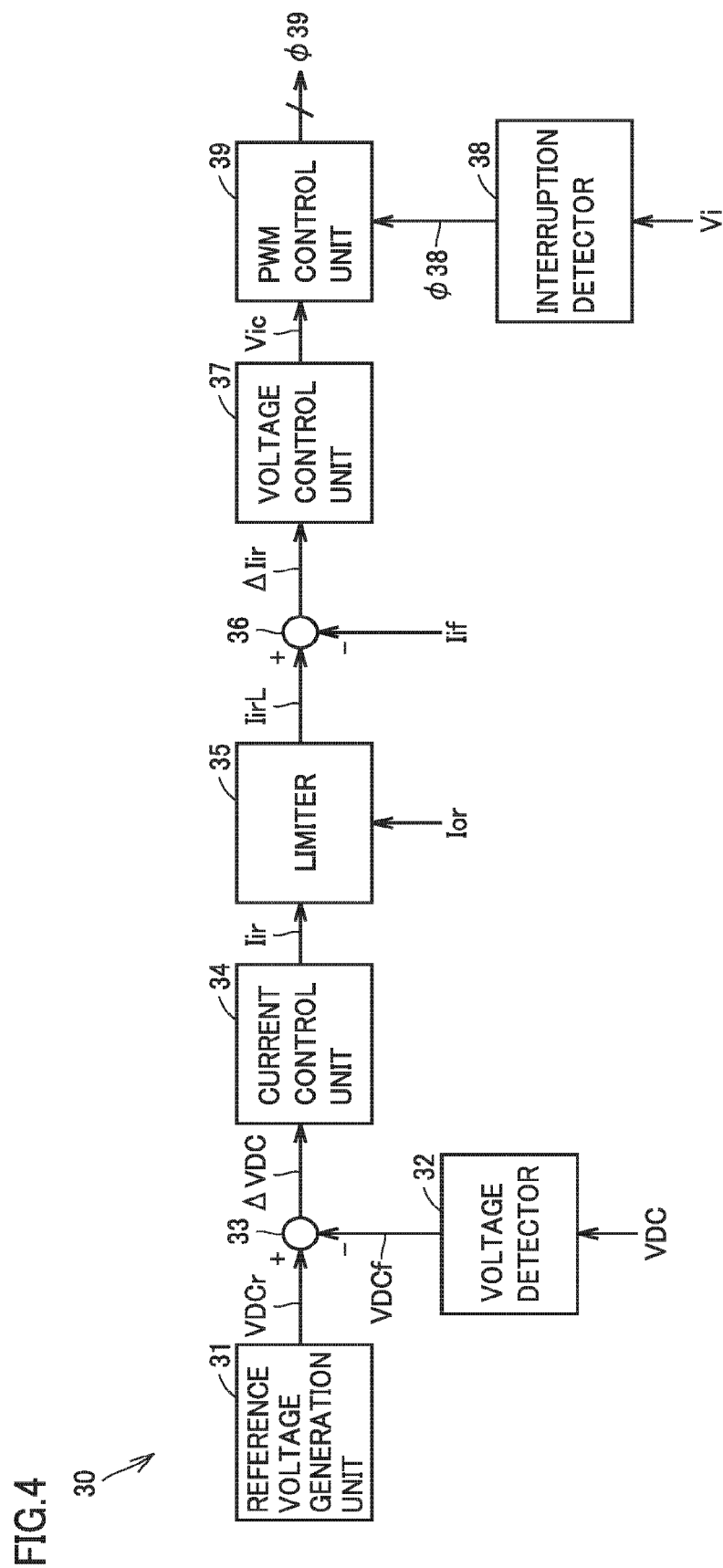
FIG. 4 is a block diagram showing the configuration of a portion pertaining to control of a converter in the controller shown in FIG. 1.

FIG. 4 is a block diagram showing the configuration of a portion pertaining to control of converter 1 in controller 8. In FIG. 4, controller 8 includes a control circuit 30 (second control circuit), and control circuit 30 has a reference voltage generation unit 31, a voltage detector 32, subtracters 33, 36, a current control unit 34, a limiter 35, a voltage control unit 37, an interruption detector 38, and a PWM control unit 39.

Reference voltage generation unit 31 generates reference DC voltage VDCr which is the target DC voltage at DC line 2. Voltage detector 32 detects DC voltage VDC at DC line 2, and generates a signal VDCf indicating the detected value. Subtracter 33 determines a deviation $\Delta$VDC=VDCr−VDCf between reference DC voltage VDCr and output signal VDCf from voltage detector 32. Current control unit 34 adds a value proportionate to deviation $\Delta$VDC and a value proportionate to an integrated value of deviation $\Delta$VDC, to determine a current command value Iir (second current command value).

Limiter 35 generates a current command value IirL (third current command value) by limiting current command value Iir such that a sum of current command value Iir from current control unit 34 and current command value Ior from current control unit 24 (FIG. 3) (Iir+Ior) does not exceed an upper limit value Ih. When Iir+Ior≤Ih is satisfied, Iir serves as IirL without change. When Iir+Ior>Ih is satisfied, Ih−Ior serves as IirL.

The value of Ih is set such that the sum of input power Pi to converter 1 and output power Po from inverter 5 (Pi+Po) reaches power 2×PoH that is twice as high as upper limit value PoH, when Iir+Ior=Ih is satisfied. When power consumption PL of load 13 increases, each of Iir and Ior increases, and each of input power Pi to converter 1 and output power Po from inverter 5 increases.

When the sum of input power Pi to converter 1 and output power Po from inverter 5 (Pi+Po) reaches power 2×PoH that is twice as high as upper limit value PoH, Iir+Ior reaches Ih. When power consumption PL of load 13 increases further, Ior increases and output power Po from inverter 5 increases, while Iir is reduced such that Iir+Ior does not exceed Ih, causing a decrease in input power Pi to converter 1. Thus, Pi+Po is limited to 2×PoH or lower.

Subtracter 36 determines a deviation $\Delta$Ii=IirL−Iif between current command value IirL and output signal Iif from current detector CD1. Voltage control unit 37 adds a value proportionate to deviation $\Delta$Ii and a value proportionate to an integrated value of deviation $\Delta$Ii, to generate a voltage command value Vic.

Interruption detector 38 determines whether commercial AC power source 11 is sound or not based on AC voltage Vi supplied from commercial AC power source 11 (FIG. 1), and outputs a signal $\phi$38 indicating a determination result. When AC voltage Vi is higher than a lower limit value ViL, it is determined that commercial AC power source 11 is sound, and signal $\phi$38 is set to an "H" level. When AC voltage Vi falls below lower limit value ViL, it is determined that an interruption of commercial AC power source 11 has occurred, and signal $\phi$38 is set to an "L" level.

When signal $\phi$38 is at the "H" level, PWM control unit 39 compares voltage command value Vic and a triangular wave signal to generate a PWM control signal $\phi$39, and provides the generated signal to converter 1. Converter 1 converts AC power into DC power in accordance with PWM control signal φ39.

When signal φ38 is at the "L" level, PWM control unit 39 fixes PWM control signal φ39 at an "L" level which is a deactivation level. In this case, the operation of converter 1 is stopped.

That is, control circuit 30 generates current command value Iir such that DC voltage VDC at DC line 2 reaches reference DC voltage VDCr, limits current command value Iir such that the sum of current command values Iir and Ior does not exceed upper limit value Ih and generates current command value IirL, and controls converter 1 such that detected value Ii from current detector CD1 reaches current command value IirL. Accordingly, converter 1 is controlled such that the sum of input power Pi to converter 1 and output power Po from inverter 5 is power 2×PoH, which is twice as high as upper limit value PoH, or lower.

Figure 5:
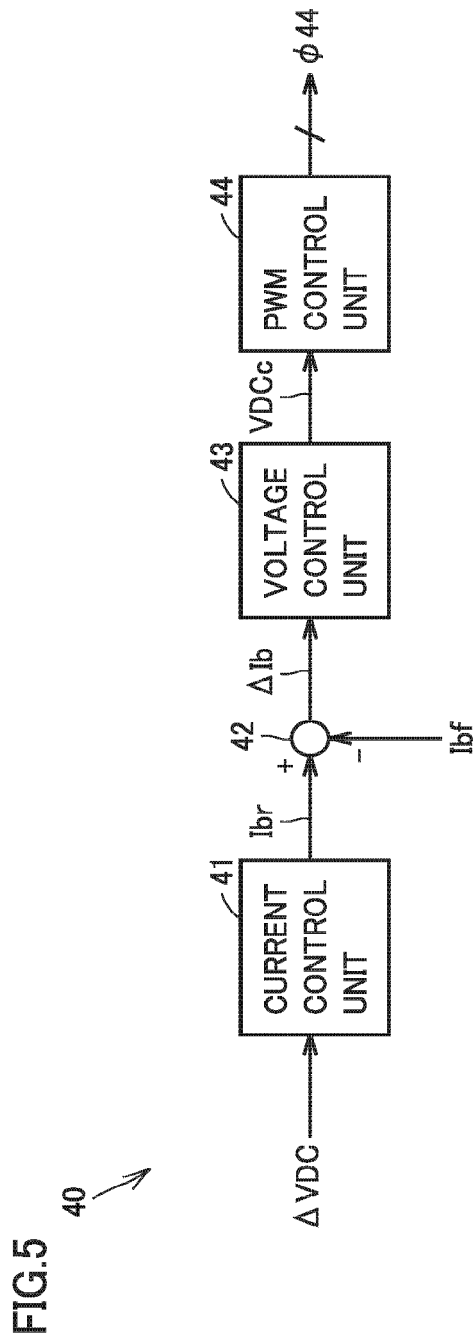
FIG. 5 is a block diagram showing the configuration of a portion pertaining to step-up control of a bidirectional chopper in the controller shown in FIG. 1.

FIG. 5 is a block diagram showing the configuration of a portion pertaining to step-up control of bidirectional chopper 4 in controller 8. In FIG. 5, controller 8 includes a control circuit 40 (third control circuit), and control circuit 40 has a current control unit 41, a subtracter 42, a voltage control unit 43, and a PWM control unit 44.

Current control unit 41 adds a value proportionate to deviation ΔVDC from subtracter 33 (FIG. 4) and a value proportionate to an integrated value of deviation ΔVDC, to determine a current command value Ibr (fourth current command value). Subtracter 42 determines a deviation ΔIb=Ibr−Ibf between current command value Ibr and output signal Ibf from current detector CD2. Voltage control unit 43 adds a value proportionate to deviation ΔIb and a value proportionate to an integrated value of deviation ΔIb, to generate a voltage command value VDCc.

PWM control unit 44 compares voltage command value VDCc and a triangular wave signal to generate a PWM control signal φ44, and provides the generated signal to bidirectional chopper 4. As a result, step-up operation of bidirectional chopper 4 is performed, where a current flows from battery 12 to DC line 2 through bidirectional chopper 4, leading to discharge of battery 12.

That is, control circuit 40 generates current command value Ibr such that DC voltage VDC at DC line 2 reaches reference DC voltage VDCr, and controls bidirectional chopper 4 such that detected value Ib from current detector CD2 reaches current command value Ibr. As a result, a sum of input power Pi to converter 1 and power Pb supplied from battery 12 to DC line 2 through bidirectional chopper 4 serves as output power Po from inverter 5.

Figure 6:
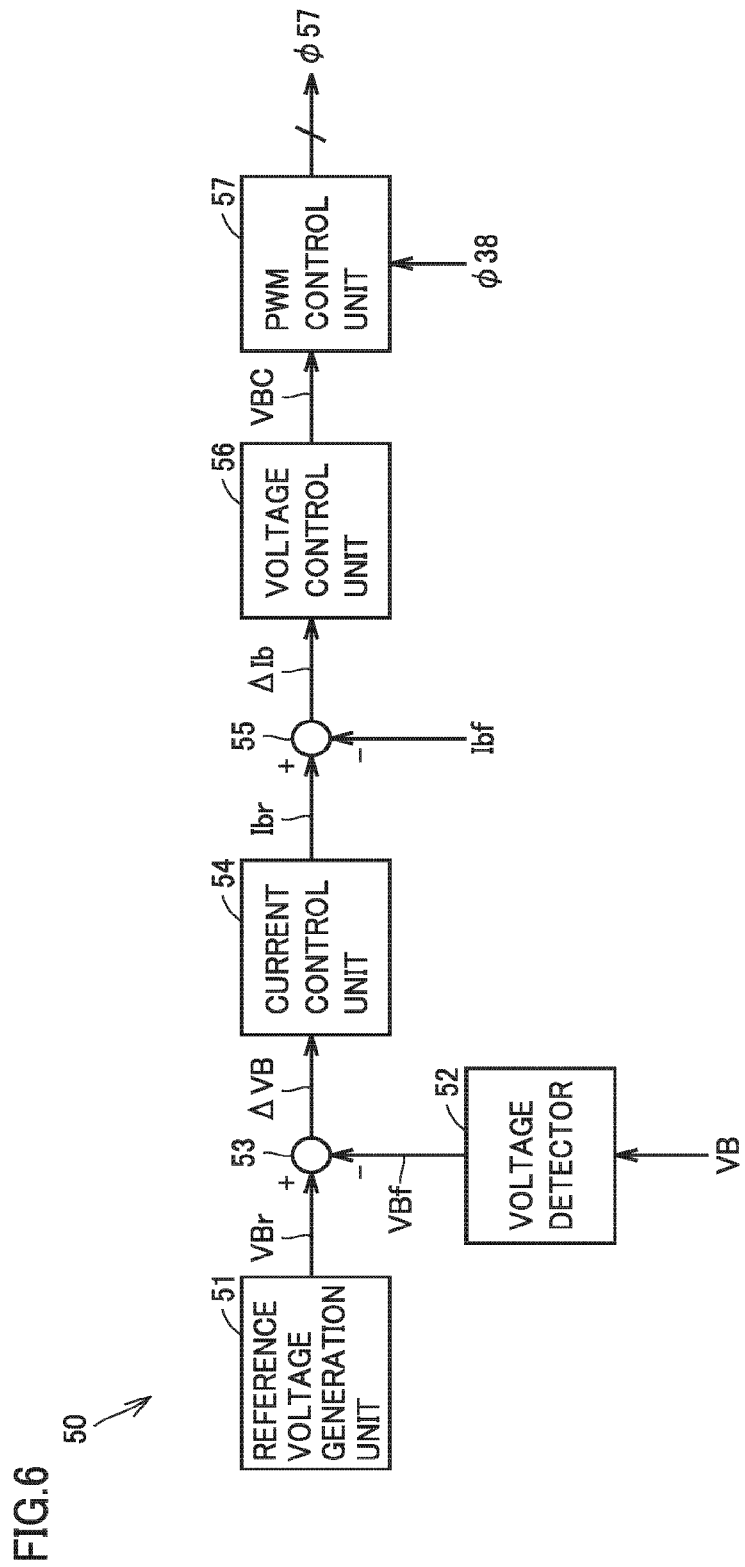
FIG. 6 is a block diagram showing the configuration of a portion pertaining to step-down control of the bidirectional chopper in the controller shown in FIG. 1.

FIG. 6 is a block diagram showing the configuration of a portion pertaining to step-down control of bidirectional chopper 4 in controller 8. In FIG. 6, controller 8 includes a control circuit 50, and control circuit 50 has a reference voltage generation unit 51, a voltage detector 52, subtracters 53, 55, a current control unit 54, a voltage control unit 56, and a PWM control unit 57.

Reference voltage generation unit 51 generates reference battery voltage VBr, which is the rated voltage of battery 12. Voltage detector 52 detects inter-terminal voltage VB of battery 12, and generates a signal VBf indicating the detected value. Subtracter 53 determines a deviation ΔVB=VBr−VBf between reference battery voltage VBr and output signal VBf from voltage detector 52. Current control unit 54 adds a value proportionate to deviation ΔVB and a value proportionate to an integrated value of deviation ΔVB, to determine current command value Ibr.

Subtracter 55 determines a deviation ΔIb=Ibr−Ibf between current command value Ibr and output signal Ibf from current detector CD2. Voltage control unit 56 generates a voltage command value VBc proportional to deviation ΔIb. PWM control unit 57 is activated when output signal φ38 from interruption detector 38 (FIG. 4) is at the "H" level (when commercial AC power source 11 is sound), and compares voltage command value VBc and a triangular wave signal to generate a PWM control signal φ57 and provides the generated signal to bidirectional chopper 4.

As a result, step-down operation of bidirectional chopper 4 is performed, where current Ib flows from DC line 2 to battery 12 through bidirectional chopper 4, leading to charge of battery 12. PWM control unit 57 is deactivated when output signal φ38 from interruption detector 38 (FIG. 4) is at the "L" level (when commercial AC power source 11 is interrupted), and fixes PWM control signal φ57 at an "L" level which is the deactivation level.

Next, operation of the uninterruptible power supply shown in FIGS. 1 to 6 is described. During a normal time when output power Po from inverter 5 is smaller than upper limit value PoH while commercial AC power source 11 is sound, AC power from commercial AC power source 11 is converted into DC power by converter 1, and stored in battery 12 through bidirectional chopper 4, and also converted into AC power by inverter 5 and supplied to load 13.

After battery 12 has been charged to the rated voltage (reference battery voltage VBr), the DC power supplied from converter 1 to battery 12 is sufficiently smaller than the DC power supplied from converter 1 to inverter 5. During the normal time, therefore, input power Pi to converter 1 is substantially equal to output power Po from inverter 5.

During an overload when output power Po from inverter 5 exceeds upper limit value PoH while commercial AC power source 11 is sound, DC power is supplied from converter 1 to inverter 5, and DC power of battery 12 is supplied to inverter 5 through bidirectional chopper 4. The DC power from converter 1 and bidirectional chopper 4 is converted into AC power by inverter 5 and supplied to load 13.

In this case, input power Pi to converter 1 is reduced by power ΔPo=PoH−Po corresponding to the difference between upper limit value PoH and output power Po from inverter 5, and input power Pb to bidirectional chopper 4 is increased by power ΔPo corresponding to the difference. During an overload, therefore, power corresponding to the sum of input power Pi to converter 1 and output power Po from inverter 5 (Pi+Po) is maintained at power 2×PoH that is twice as high as upper limit value PoH. Accordingly, the cooling capability (that is, size) of cooler 6 (FIGS. 1 and 2) can be suppressed to low level.

During an interruption of commercial AC power source 11, the operation of converter 1 is stopped, and DC power of battery 12 is supplied to inverter 5 through bidirectional chopper 4, converted into AC power and supplied to load 13. Thus, in the case of an interruption, the operation of load 13 can be continued by DC power of battery 12.

Figure 7:
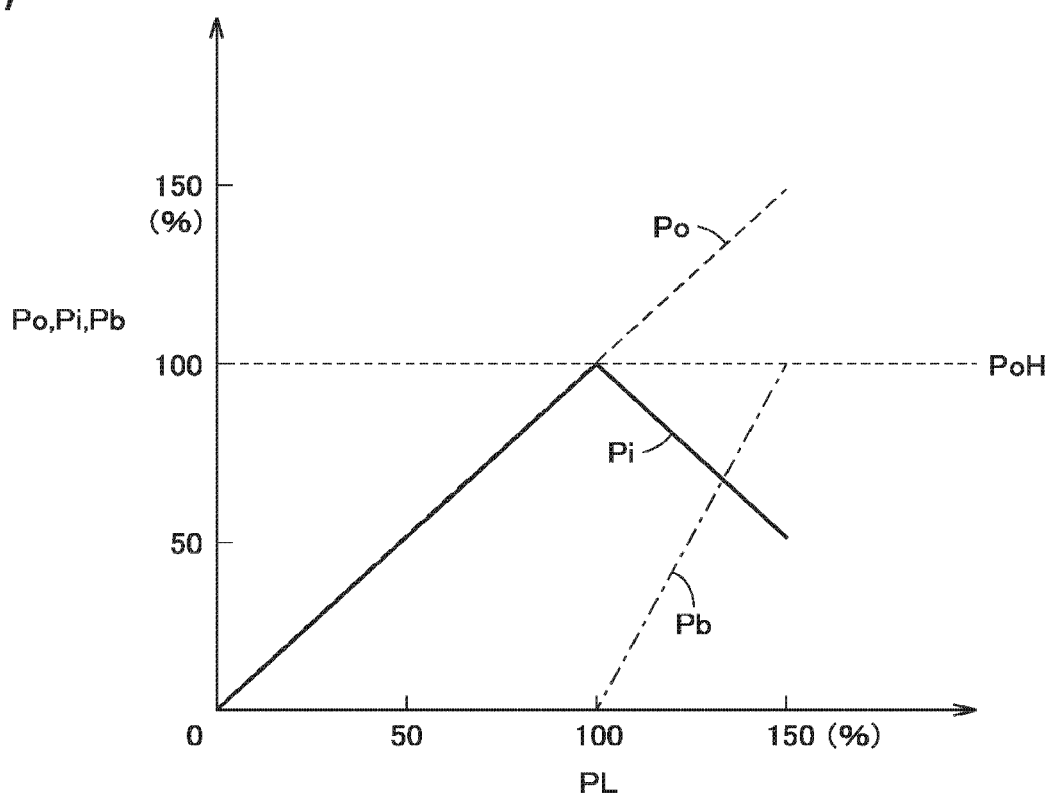
FIG. 7 illustrates an effect of the first embodiment.

FIG. 7 illustrates an effect of the first embodiment. In FIG. 7, power consumption PL of load 13 is indicated on the horizontal axis, and each of output power Po from inverter 5, input power Pi to converter 1, and input power Pb to bidirectional chopper 4 (that is, output power from battery 12) is indicated on the vertical axis. In addition, power corresponding to upper limit value PoH of output power Po from inverter 5 is represented as 100(%). Inverter 5 has a capability to output power of 150(%).

Output power Po from inverter 5 is equal to power consumption PL of load 13. When power consumption PL of load 13 increases from 0(%) to 150(%), output power Po from inverter 5 increases from 0(%) to 150(%).

When power consumption PL of load 13 is between 0 and 100(%), input power Pi to converter 1, output power Po from inverter 5, and power consumption PL of load 13 are equal to one another. When power consumption PL of load 13 increases from 0(%) to 100(%), each of input power Pi to converter 1 and output power Po from inverter 5 increases from 0(%) to 100(%).

When power consumption PL of load 13 is between 100 and 150(%), input power Pi to converter 1 is reduced by power $\Delta Po=PoH-Po$ corresponding to the difference between upper limit value PoH of output power Po from inverter 5 and output power Po from inverter 5, and input power Pb to bidirectional chopper 4 is increased by power $2\times\Delta Po$ that is twice as high as power $\Delta Po$ corresponding to the difference.

Thus, even when power consumption PL of load 13 increases from 100(%) to 150(%), the power corresponding to the sum of input power Pi to converter 1 and output power Po from inverter 5 (Pi+Po) is maintained at power $2\times PoH$ of 200(%). In the first embodiment, therefore, it is only required to provide cooler 6 sized to dissipate heat generated at converter 1 and inverter 5 when Pi+Po=200(%) is satisfied.

Figure 8:
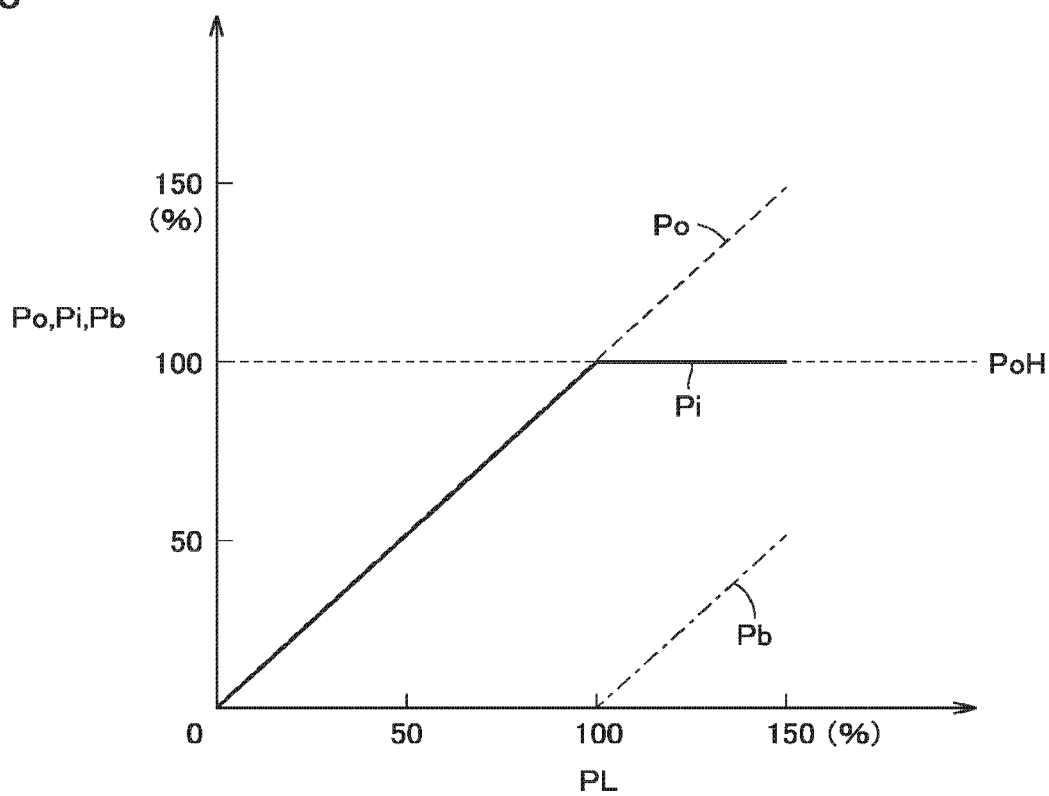
FIG. 8 illustrates a comparative example of the first embodiment.

FIG. 8 illustrates a comparative example, which is shown as compared with FIG. 7. Referring to FIG. 8, this comparative example differs from the first embodiment in that, when power consumption PL of load 13 is between 100 and 150(%), input power Pi to converter 1 is maintained at 100(%), and a shortage of power Po−Pi is compensated for by a supply from bidirectional chopper 4.

When power consumption PL of load 13 increases from 100(%) to 150(%), therefore, the power corresponding to the sum of input power Pi to converter 1 and output power Po from inverter 5 (Pi+Po) increases from 200(%) to 250(%). In the comparative example, therefore, it is required to provide a cooler sized to dissipate heat generated at converter 1 and inverter 5 when Pi+Po=250(%) is satisfied. Accordingly, the size of the cooler in the comparative example is 250/200=5/4 times the size of cooler 6 in the first embodiment.

As described above, in the first embodiment, when output power Po from inverter 5 exceeds upper limit value PoH, input power Pi to converter 1 is reduced by power $\Delta Po=PoH-Po$ corresponding to the difference between upper limit value PoH of output power Po from inverter 5 and output power Po from inverter 5, and input power Pb to bidirectional chopper 4 is increased by power $2\times\Delta Po$ that is twice as high as power $\Delta Po$ corresponding to the difference. Thus, input power Pb to converter 1 can be limited to upper limit value PoH or lower. In addition, even during an overload, the power corresponding to the sum of input power Pi to converter 1 and output power Po from inverter 5 (Pi+Po) can be maintained at $2\times PoH$ or lower, leading to a reduced size of cooler 6.

Second Embodiment

Figure 9:
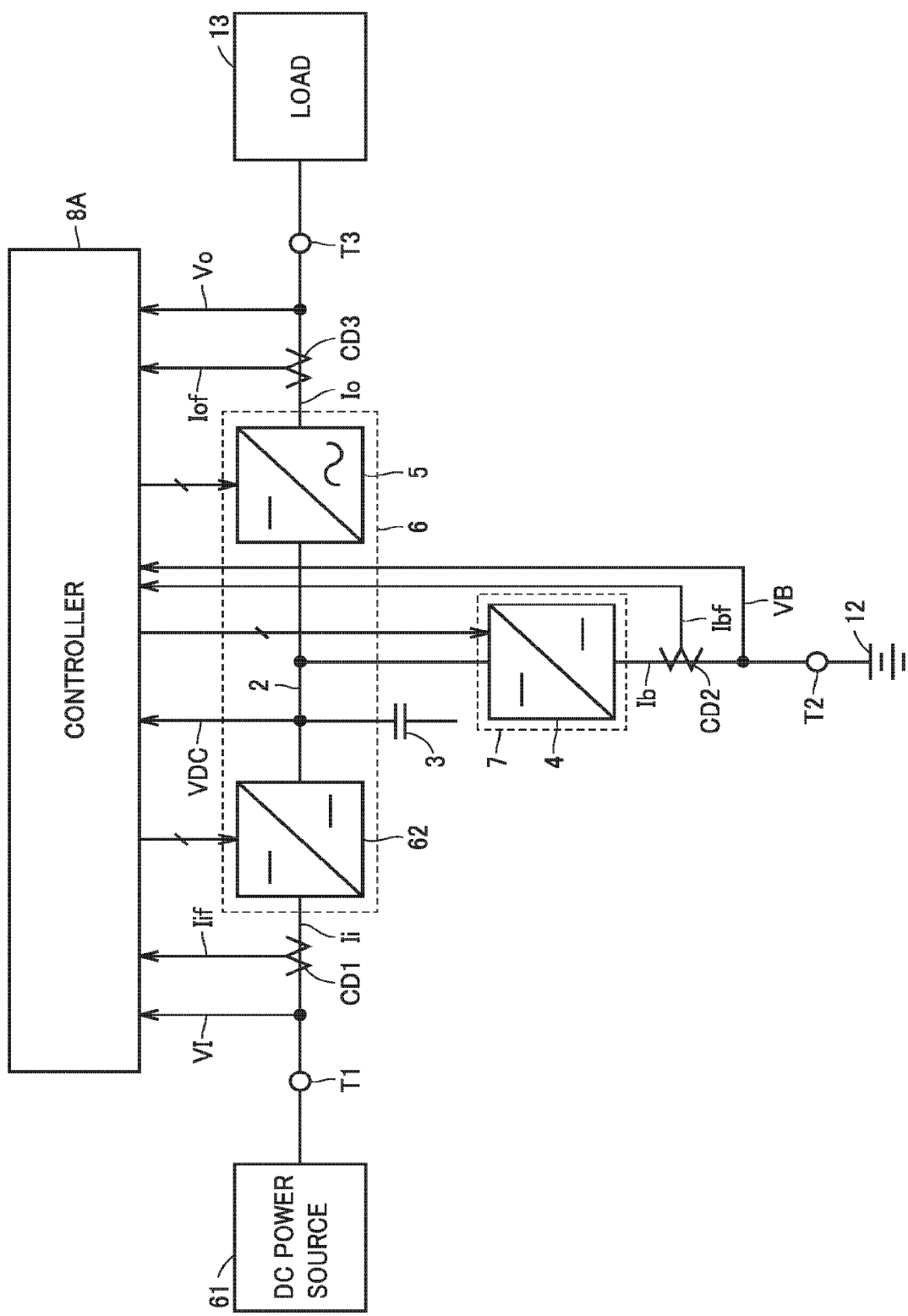
FIG. 9 is a block diagram showing the configuration of an uninterruptible power supply according to a second embodiment of the present invention.

FIG. 9 is a block diagram showing the configuration of an uninterruptible power supply according to a second embodiment of the present invention, which is shown as compared with FIG. 1. Referring to FIG. 9, this uninterruptible power supply differs from the uninterruptible power supply in FIG. 1 in that input terminal T1 is connected to a DC power source 61, converter 1 is replaced by a DC-DC converter 62, and controller 8 is replaced by a controller 8A.

DC power source 61 (first power source) is a fuel cell, for example, which generates DC power and outputs the generated power to input terminal T1. An instantaneous value of a DC voltage VI supplied from DC power source 61 is detected by controller 8A. Current detector CD1 detects input current Ii to DC-DC converter 62, and outputs signal Iif indicating the detected value to controller 8A.

Controller 8A controls each of DC-DC converter 62, bidirectional chopper 4, and inverter 5 based on DC voltage VI, AC output voltage Vo, DC voltage VDC, battery voltage VB, AC input current Ii, DC current Ib, and AC current Io.

DC-DC converter 62 (first power converter) is controlled by controller 8A, and converts DC power having DC voltage VI supplied from DC power source 61 into DC power having reference DC voltage VDCr and outputs the converted power to DC line 2. DC-DC converter 62 is a known DC-DC converter including a plurality of sets of IGBTs and diodes. DC input current Ii to DC-DC converter 62 is controllable.

During a normal time when output power Po from inverter 5 is smaller than upper limit value PoH while DC power is normally supplied from DC power source 61 (while DC power source 61 is sound), DC input current Ii to DC-DC converter 62 is controlled such that DC voltage VDC at DC line 2 reaches reference DC voltage VDCr.

During an overload when output power Po from inverter 5 exceeds upper limit value PoH while DC power source 61 is sound, DC input current Ii to DC-DC converter 62 is reduced such that input power Pi to DC-DC converter 62 decreases by power $\Delta Po=Po-PoH$ corresponding to the difference between output power Po from inverter 5 and upper limit value PoH. When the supply of DC power from DC power source 61 is stopped (when DC power source 61 is interrupted), the operation of DC-DC converter 62 is stopped.

Cooler 6 is provided in common for DC-DC converter 62 and inverter 5, and dissipates heat generated at DC-DC converter 62 and inverter 5 into the air. Cooler 6, DC-DC converter 62 and inverter 5 constitute an integral unit.

Next, operation of the uninterruptible power supply shown in FIG. 9 is described. During a normal time when output power Po from inverter 5 is smaller than upper limit value PoH while DC power source 61 is sound, DC power from DC power source 61 is converted into DC power having reference DC voltage VDCr by DC-DC converter 62, and stored in battery 12 through bidirectional chopper 4, and also converted into AC power by inverter 5 and supplied to load 13.

After battery 12 has been charged to the rated voltage (reference battery voltage VBr), the DC power supplied from DC-DC converter 62 to battery 12 is sufficiently smaller than the DC power supplied from DC-DC converter 62 to inverter 5. During the normal time, therefore, input power Pi to DC-DC converter 62 is substantially equal to output power Po from inverter 5.

During an overload when output power Po from inverter 5 exceeds upper limit value PoH while DC power source 61 is sound, DC power is supplied from DC-DC converter 62 to inverter 5, and DC power of battery 12 is supplied to inverter 5 through bidirectional chopper 4. The DC power from DC-DC converter 62 and bidirectional chopper 4 is converted into AC power by inverter 5 and supplied to load 13.

In this case, input power Pi to DC-DC converter 62 is reduced by power $\Delta Po=PoH-Po$ corresponding to the difference between upper limit value PoH and output power Po from inverter 5, and input power Pb to bidirectional chopper 4 is increased by power 2×ΔPo that is twice as high as power ΔPo corresponding to the difference. Thus, the power corresponding to the sum of input power Pi to DC-DC converter 62 and output power Po from inverter 5 (Pi+Po) is maintained at power that is twice as high as upper limit value PoH. Accordingly, the cooling capability (that is, size) of cooler 6 can be suppressed to low level.

During an interruption of DC power source 61, the operation of DC-DC converter 62 is stopped, and DC power of battery 12 is supplied to inverter 5 through bidirectional chopper 4, converted into AC power and supplied to load 13. Thus, in the case of an interruption, the operation of load 13 can be continued by DC power of battery 12.

As described above, in the second embodiment, when output power Po from inverter 5 exceeds upper limit value PoH, input power Pi to DC-DC converter 62 is reduced by power ΔPo=PoH−Po corresponding to the difference between upper limit value PoH of output power Po from inverter 5 and output power Po from inverter 5, and input power Pb to bidirectional chopper 4 is increased by power 2×ΔPo that is twice as high as power ΔPo corresponding to the difference. Thus, input power Pi to DC-DC converter 62 can be limited to upper limit value PoH or lower. In addition, the power corresponding to the sum of input power Pi to DC-DC converter 62 and output power Po from inverter 5 (Pi+Po) can be maintained at 2×PoH or lower, leading to a reduced size of cooler 6.

Third Embodiment

Figure 10:
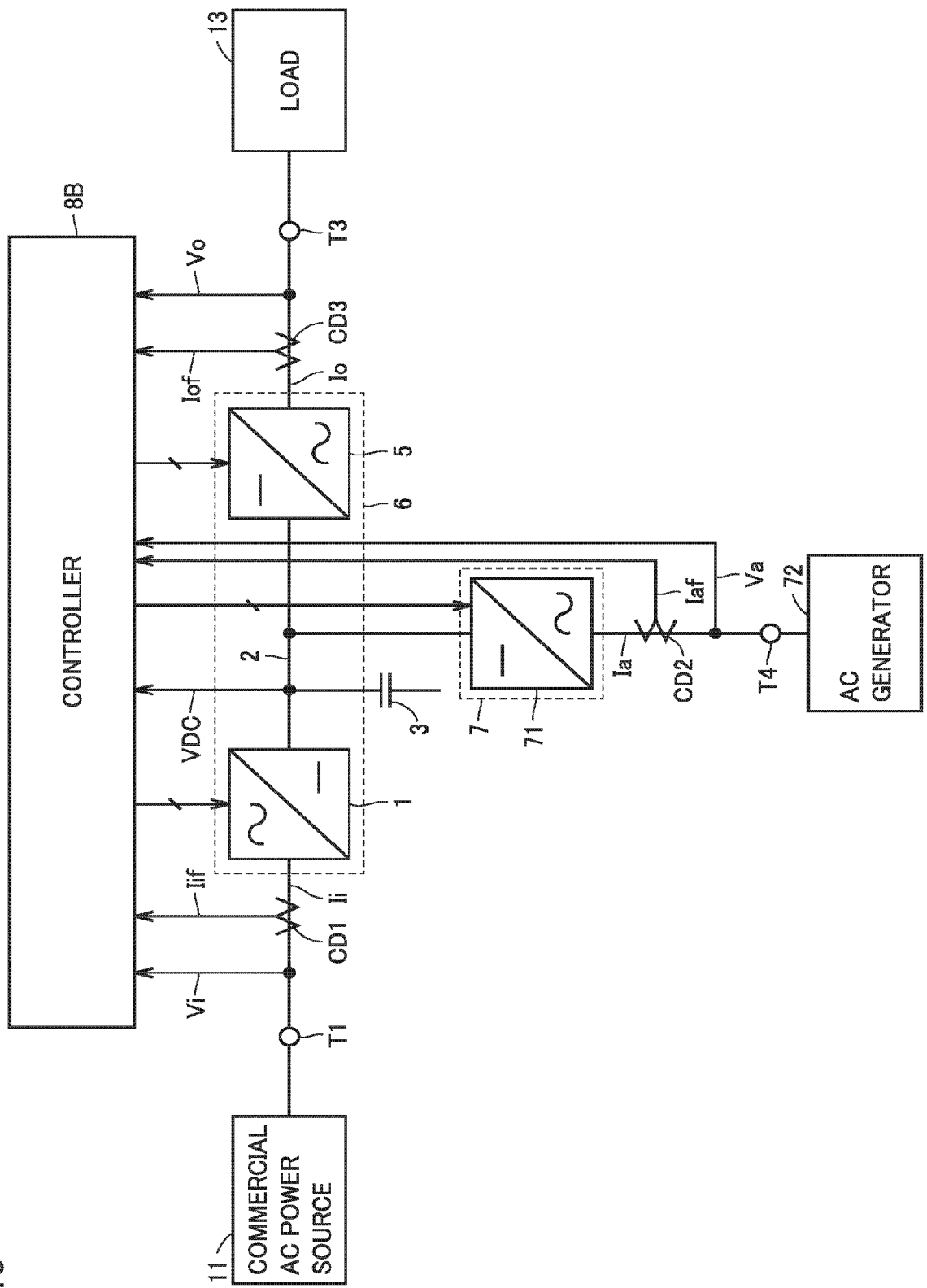
FIG. 10 is a block diagram showing the configuration of an uninterruptible power supply according to a third embodiment of the present invention.

FIG. 10 is a block diagram showing the configuration of an uninterruptible power supply according to a third embodiment of the present invention, which is shown as compared with FIG. 1. Referring to FIG. 10, this uninterruptible power supply differs from the uninterruptible power supply in FIG. 1 in that battery terminal T2, bidirectional chopper 4 and controller 8 are replaced by an AC terminal T4, a converter 71 and a controller 8B, respectively, and that AC terminal T4 is connected to an AC generator 72.

AC generator 72 (second power source) generates AC power and outputs the generated power to AC terminal T4. An instantaneous value of an AC voltage Va output from AC generator 72 is detected by controller 8B. Current detector CD2 detects an input current Ia to converter 71, and outputs a signal Iaf indicating the detected value to controller 8B.

Controller 8B controls each of converters 1, 71 and inverter 5 based on DC voltage VI, AC output voltage Vo, DC voltage VDC, AC voltage Va, AC input current Ii, AC current Ia, and AC output current Io.

Converter 71 (second power converter) is controlled by controller 8B, and converts AC power from AC generator 72 into DC power and outputs the converted power to DC line 2. Converter 71 is a known converter including a plurality of sets of IGBTs and diodes. AC input current Ia to converter 71 is controllable. Cooler 7 dissipates heat generated at converter 71.

During a normal time when output power Po from inverter 5 is smaller than upper limit value PoH while AC power is normally supplied from commercial AC power source 11 (while commercial AC power source 11 is sound), AC input current Ii to converter 1 is controlled such that DC voltage VDC at DC line 2 reaches reference DC voltage VDCr. In this case, converter 71 is controlled such that input current Ia to converter 71 becomes zero.

During an overload when output power Po from inverter 5 exceeds upper limit value PoH while commercial AC power source 11 is sound, AC input current Ii to converter 1 is reduced such that input power Pi to converter 1 decreases by power ΔPo=Po−PoH corresponding to the difference between output power Po from inverter 5 and upper limit value PoH, and AC input current Ia to converter 71 is increased such that input power Pa to converter 71 increases by power 2×ΔPo that is twice as high as power ΔPo corresponding to the difference.

When the supply of AC power from commercial AC power source 11 is stopped (when commercial AC power source 11 is interrupted), the operation of converter 1 is stopped, and AC input current Ia to converter 71 is controlled such that DC voltage VDC at DC line 2 reaches reference DC voltage VDCr.

Next, operation of the uninterruptible power supply shown in FIG. 10 is described. During a normal time when output power Po from inverter 5 is smaller than upper limit value PoH while commercial AC power source 11 is sound, AC power from commercial AC power source 11 is converted into DC power by converter 1, and converted into AC power by inverter 5 and supplied to load 13.

During an overload when output power Po from inverter 5 exceeds upper limit value PoH while commercial AC power source 11 is sound, DC power is supplied from both converters 1 and 71 to inverter 5. The DC power from converters 1 and 71 is converted into AC power by inverter 5 and supplied to load 13.

In this case, input power Pi to converter 1 is reduced by power ΔPo=PoH−Po corresponding to the difference between upper limit value PoH and output power Po from inverter 5, and input power Pa to converter 71 is increased by power 2×ΔPo that is twice as high as power ΔPo corresponding to the difference. Thus, the power corresponding to the sum of input power Pi to converter 1 and output power Po from inverter 5 (Pi+Po) is maintained at power 2×PoH that is twice as high as upper limit value PoH. Accordingly, the cooling capability (that is, size) of cooler 6 can be suppressed to low level.

During an interruption of commercial AC power source 11, the operation of converter 1 is stopped, and DC power generated by converter 71 is supplied to inverter 5, converted into AC power and supplied to load 13. Thus, in the case of an interruption, the operation of load 13 can be continued by AC power of AC generator 72.

As described above, in the third embodiment, when output power Po from inverter 5 exceeds upper limit value PoH, input power Pi to converter 1 is reduced by power ΔPo=PoH−Po corresponding to the difference between upper limit value PoH of output power Po from inverter 5 and output power Po from inverter 5, and input power Pa to converter 71 is increased by power 2×ΔPo that is twice as high as power ΔPo corresponding to the difference. Thus, input power Pi to converter 1 can be limited to upper limit value PoH or lower. In addition, the power corresponding to the sum of input power Pi to converter 1 and output power Po from inverter 5 (Pi+Po) can be maintained at 2×PoH or lower, leading to a reduced size of cooler 6.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

T1 input terminal; T2 battery terminal; T3 output terminal; T4 AC terminal; CD1 to CD3 current detector; 1, 71 converter; 2 DC line; 3 capacitor; 4 bidirectional chopper; 5 inverter; 6, 7 cooler; 6a flat plate portion; 6b heat dissipating fin; 8, 8A, 8B controller; 15 substrate; 20, 30, 40, 50 control circuit; 21, 31, 51 reference voltage generation unit; 22, 32, 52 voltage detector; 23, 25, 33, 36, 42, 53, 55 subtracter; 24, 34, 41, 54 current control unit; 26, 37, 43, 56 voltage control unit; 27, 39, 44, 57 PWM control unit; 35 limiter; 38 interruption detector; 61 DC power source; 62 DC-DC converter; 72 AC generator.

The invention claimed is:

1. A power conversion device comprising:
a first power converter that converts first power supplied from a first power source into DC power;
a second power converter that converts second power supplied from a second power source into DC power;
a third power converter that converts DC power supplied from at least one of the first and second power converters into AC power and supplies the converted power to a load;
a cooler that is provided in common for the first and third power converters, and that dissipates heat generated at the first and third power converters; and
a controller, wherein
when output power from the third power converter is smaller than an upper limit value, the controller causes only the first power converter to supply DC power to the third power converter, and
in response to the output power from the third power converter exceeding the upper limit value, the controller causes both the first and second power converters to supply DC power to the third power converter, and reduces input power to the first power converter and increases input power to the second power converter while maintaining a sum of the input powers to the first and second power converters at the output power from the third power converter.

2. The power conversion device according to claim 1, wherein
the first power converter, the third power converter and the cooler constitute an integral unit.

3. The power conversion device according to claim 1, wherein
in response to the output power from the third power converter exceeding the upper limit value, the controller reduces the input power to the first power converter by power corresponding to a difference between the output power from the third power converter and the upper limit value, and increases the input power to the second power converter by power that is twice as high as the power corresponding to the difference.

4. The power conversion device according to claim 3, comprising:
a DC line for supplying DC power from the first and second power converters to the third power converter;
a first current detector that detects an input current to the first power converter;
a second current detector that detects an input current to the second power converter; and
a third current detector that detects an output current from the third power converter, wherein
the controller includes
a fist control circuit that generates a first current command value such that an input voltage to the load reaches a reference AC voltage, and controls the third power converter such that a detected value from the third current detector reaches the first current command value,
a second control circuit that generates a second current command value such that a voltage at the DC line reaches a reference DC voltage, generates a third current command value by limiting the second current command value such that a sum of the first and second current command values does not exceed a predetermined value, and controls the first power converter such that a detected value from the first current detector reaches the third current command value, and
a third control circuit that generates a fourth current command value such that the voltage at the DC line reaches the reference DC voltage, and controls the second power converter such that a detected value from the second current detector reaches the fourth current command value, and
the predetermined value is set such that a sum of the input power to the first power converter and the output power from the third power converter reaches power that is twice as high as the upper limit value, when the sum of the first and second current command values is the predetermined value.

5. The power conversion device according to claim 1, wherein
when supply of the first power from the first power converter is stopped, the controller causes only the second power converter to supply DC power to the third power converter.

6. The power conversion device according to claim 1, wherein
the first and second power sources are an AC power source and a DC power source, respectively, and
the first and second powers are AC power and DC power, respectively.

7. The power conversion device according to claim 1, wherein
the first and second power sources are first and second DC power sources, respectively, and
the first and second powers are both DC power.

8. The power conversion device according to claim 1, wherein
the first and second power sources are first and second AC power sources, respectively, and
the first and second powers are both AC power.

* * * * *